(12) United States Patent
Albasini et al.

(10) Patent No.: US 6,960,947 B2
(45) Date of Patent: Nov. 1, 2005

(54) PHASE-ERROR-COMPENSATION TECHNIQUES IN A FRACTIONAL-N PLL FREQUENCY SYNTHESIZER

(75) Inventors: Guido Gabriele Albasini, Voghera (IT); Enrico Temporiti Milani, Pavia (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 18 days.

(21) Appl. No.: 10/801,502

(22) Filed: Mar. 15, 2004

(65) Prior Publication Data

US 2004/0232960 A1 Nov. 25, 2004

(51) Int. Cl.$^7$ .............................................. H03L 7/06
(52) U.S. Cl. ...................................... 327/147; 327/156
(58) Field of Search ................................ 327/147, 148, 327/151, 156, 157, 160, 162; 331/1 A, 16, 17, 25; 373/373, 375, 376

(56) References Cited

U.S. PATENT DOCUMENTS

| | | | |
|---|---|---|---|
| 3,959,737 A | * 5/1976 | Tanis | 331/1 A |
| 4,492,936 A | 1/1985 | Albarello et al. | 332/128 |
| 5,708,687 A | 1/1998 | Powell et al. | 375/376 |
| 6,236,275 B1 | * 5/2001 | Dent | 331/1 A |
| 6,236,703 B1 | 5/2001 | Riley | 377/48 |

FOREIGN PATENT DOCUMENTS

| | | |
|---|---|---|
| DK | 10105057 | 8/2002 |
| GB | 2097206 | 10/1982 |

OTHER PUBLICATIONS

European Search Report dated Sep. 1, 2003 relating to the above prior art.

* cited by examiner

*Primary Examiner*—Linh My Nguyen
(74) *Attorney, Agent, or Firm*—Lisa K. Jorgenson; P. G. Scott Born; Graybeal Jackson Haley LLP (57) ABSTRACT

A fractional-type phase-locked loop circuit, for synthesizing an output signal multiplying a frequency of a reference signal by a selected fractional conversion factor, includes a frequency divider for generating a feedback signal dividing the frequency of the output signal by a frequency division factor selectable among at least two different integer-value division factors, and frequency divider control means for causing the frequency division factor to vary between the at least two integer-value division factors in a pre-defined number of cycles, thereby an average frequency division factor over said pre-defined number of cycles has a fractional value. Means are provided for compensating a phase error introduced by the frequency divider on the basis of a value indicative of the phase error obtained from said frequency divider control means. The phase-error compensation means includes rounding means, receiving an input binary code with a first number of binary digits, indicative of the phase error value, and providing an output binary code, with a second number of binary digits lower than the first number of digits, defining a rounded phase error value.

23 Claims, 5 Drawing Sheets

PHASE-ERROR-COMPENSATION TECHNIQUES IN A FRACTIONAL-N PLL FREQUENCY SYNTHESIZER

PRIORITY CLAIM

This application claims priority from European patent application No. 03425155.3, filed Mar. 14, 2003, which is incorporated herein by reference.

TECHNICAL FIELD

An embodiment of the present invention relates generally to frequency synthesizers, and particularly to fractional-divide-factor Phase-Locked Loops (commonly referred to as fractional-N PLLs). Specifically, an embodiment of the invention concerns techniques for compensating phase errors in fractional PLLs.

BACKGROUND

PLLs are commonly used in (indirect) frequency synthesis applications. A PLL consists of a negative feedback circuit that allows multiplying the frequency of a reference signal by a selected frequency conversion factor; this results in the generation of a tuneable and stable output signal at the desired frequency.

For this purpose, a frequency divider scales the frequency of the output signal by the conversion factor. The resulting frequency-scaled signal is fed back to a phase comparator, which detects a phase difference between the feedback signal and the reference signal. The phase comparator outputs a control current indicative of the detected phase difference. A loop filter integrates the control current into a corresponding control voltage for a Voltage-Controlled Oscillator (VCO), which varies the frequency of the output signal according to the control voltage value.

In a locked condition, the frequency of the feedback signal matches the frequency of the reference signal; therefore, the frequency of the output signal is equal to the reference frequency multiplied by the conversion factor.

A particular architecture (commonly referred to as fractional-N) has become increasingly popular over the years, especially in wireless communication applications working at high frequency. In a fractional-N PLL, differently from an integer-N PLL, the frequency conversion factor N is a non-integer, i.e., a fractional number. To this purpose, the divide factor of the frequency divider is caused to vary dynamically between different integer numbers, for example between two consecutive integers N and N+1, so as to obtain the desired, fractional average conversion factor.

The fractional-N PLL architecture allows overcoming the known limitations of integer-N PLLs, which are characterized by a trade-off between bandwidth, settling time, frequency spacing, phase noise, and power consumption.

Typically, a fractional-N PLL includes an accumulator that continuously adds to itself an adjusting value, defining a fractional component of the desired frequency conversion factor. As long as the content of the accumulator is lower than its capacity (corresponding to the maximum allowed adjusting value), the frequency divider is caused to divide the frequency of the PLL output signal by an integer component N of the fractional conversion factor; each time the accumulator overflows, the frequency divider is caused to increment the divide factor by one unit (N+1). In other words, the frequency divide factor is modulated.

A problem of fractional-N PLLs is that the feedback signal and the reference signal, even in the locked condition, are not instantaneously at the same frequency, but only so on average; the frequency difference between the two signals translates into a phase error having a value that varies with the same periodicity as the variation of the frequency-divider divide factor. The periodicity of the variation of the phase error introduces spurious signals (shortly referred to as spurs) rather close to the frequency of the PLL output signal, the frequency offsets of the spurs from the output signal frequency corresponding to harmonics of the periodicity of the modulation pattern for the frequency divider.

A known technique for reducing the energy level of the spurs calls for compensating the above-mentioned phase error. This technique is based on the consideration that the accumulator used to control the divide factor of the frequency divider actually behaves as a phase-error accumulator and, in the locked condition, the value in the accumulator represents the phase error between the feedback signal and the reference signal. The content of the accumulator, properly scaled, is thus converted by a Digital-to-Analog Converter (DAC) into a corresponding compensation current, that is added to the control current generated by the phase comparator.

A problem of the above-mentioned phase-error compensation technique relates to the resolution required for the DAC generating the compensation current. In principle, a DAC having the same number of bits as the counter in the accumulator needs to be employed. The number of bits of the accumulator is related to the number of different channels that can be selected, and can be very high; for example, it may be necessary to have $2^{16}$ or even $2^{20}$ different channels, so that accumulators of sixteen bits or even twenty bits are needed.

Designing and implementing a multibit DAC with such a high level of resolution is a challenging and almost impractical task; just to cite one problem, the power consumption of such a DAC would be very high.

SUMMARY OF THE INVENTION

In view of the state of the art outlined in the foregoing, an embodiment of the present invention devises a solution to the problem of implementing phase-error compensation techniques also when the number of different channels is very high.

In particular, an embodiment of the present invention reduces the resolution requirements in the generation of the phase-error compensation signal, so as to make the implementation of phase-error compensation techniques practical and not too costly.

According to an embodiment of the present invention, these and other objects are attained by means of a fractional-type phase-locked loop circuit, for synthesising an output signal multiplying a frequency of a reference signal by a selected fractional conversion factor.

Briefly stated, the phase-locked loop circuit includes a frequency divider for generating a feedback signal dividing the frequency of the output signal by a frequency division factor selectable among at least two different integer-value division factors; frequency divider control means are provided for causing the frequency division factor to vary between the at least two integer-value division factors in a pre-defined number of cycles, thereby an average frequency division factor over said pre-defined number of cycles has a fractional value; means are also provided for compensating a phase error introduced by the frequency divider on the basis of a value indicative of the phase error obtained from said frequency divider control means.

The phase-error compensation means includes rounding means, receiving an input binary code with a first number of binary digits, carrying said value indicative of the phase error, and providing an output binary code, with a second number of binary digits lower than the first number of digits, defining a rounded phase error value.

BRIEF DESCRIPTION OF THE DRAWINGS

These and other features and advantages of the present invention will be made apparent by the following detailed description of some embodiments thereof, provided merely by way of non-limitative examples, which will be made in connection with the attached drawings, wherein.

In the drawings, same reference numerals are adopted to identify same or corresponding parts in different embodiments of the invention.

DETAILED DESCRIPTION

Figure 1:
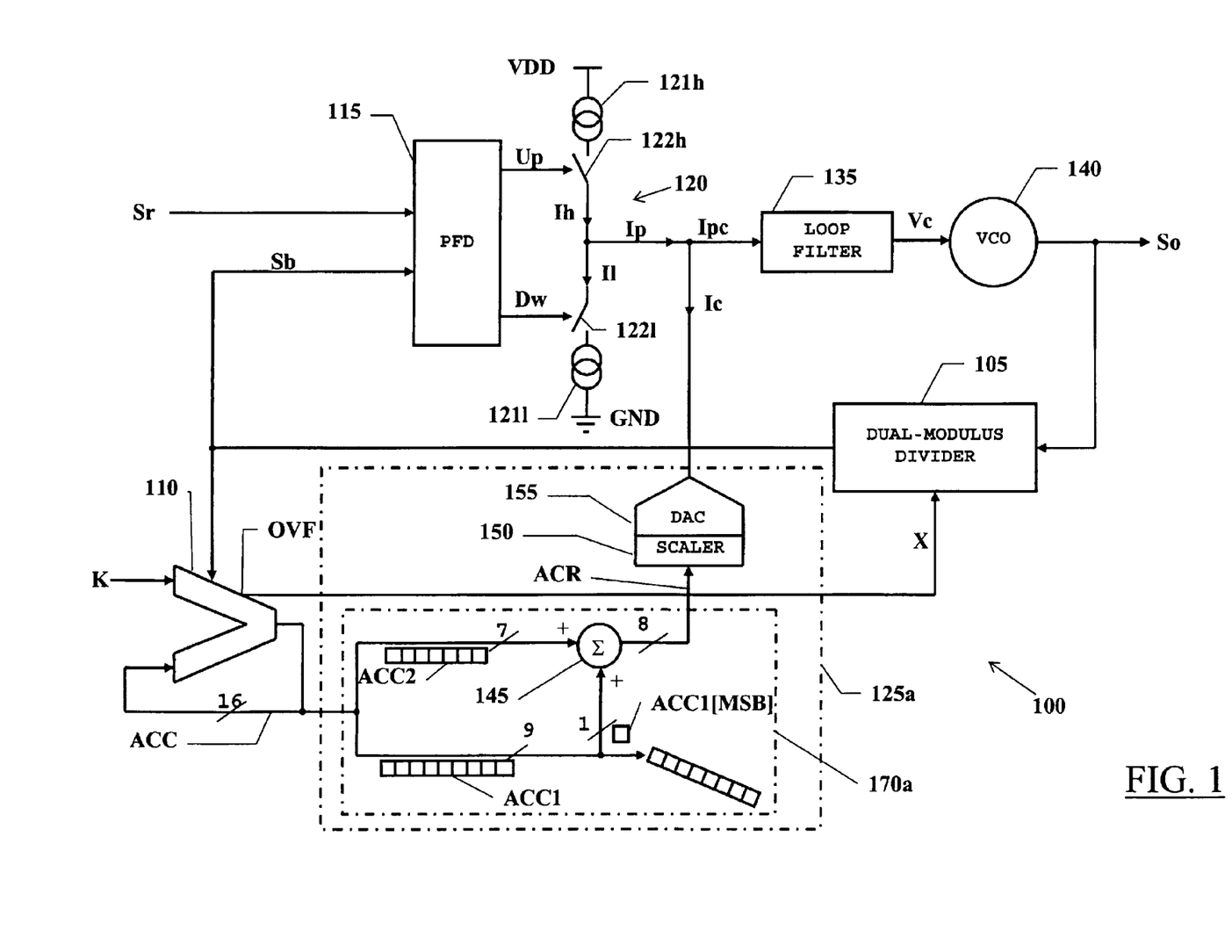
FIG. 1 schematically shows, in terms of functional blocks, a fractional-N PLL frequency synthesizer including a phase-error-compensation circuit, according to a first embodiment of the invention.

With reference to FIG. 1, a digital, fractional-N PLL 100 is shown. The PLL 100 is used to synthesize an output signal So, having a desired frequency Fo. The output signal So is obtained starting from a reference signal Sr, having a frequency Fr (the reference frequency); in particular, the frequency Fo of the output signal So is equal to the reference frequency Fr multiplied by a selected, fractional frequency conversion factor. The reference signal Sr is, for example, generated by a crystal oscillator (not shown in the drawings), which provides a stable and accurate time base.

The PLL 100 implements a feedback loop through a multi-modulus frequency divider 105 (in the shown example, a dual-modulus frequency divider), which generates a feedback signal Sb of frequency Fb starting from the output signal So. The frequency divider 105 is controlled by a modulation signal X, having a value X[n], where n denotes the n-th cycle of the feedback signal Sb. The instantaneous frequency divide factor applied by the frequency divider 105 to the output signal So depends on the instantaneous value X[n] of the modulation signal X; for example, in the case of a dual-modulus divider 105, the modulation signal X can be a one-bit digital signal, and the value X[n] at the n-th cycle of the feedback signal Sb is either a logic "0" or a logic "1"; for X[n]="0" the frequency divide factor of the frequency divider 105 is equal to a first integer value N, while for X[n]="1" the frequency divide factor is equal to a second integer value N+1. The instantaneous value X[n] of the modulation signal X thus determines the frequency divide factor of the frequency divider 105, and is therefore used for modulating the frequency divide factor about the nominal value N, which defines an integer component of a selected channel of operation of the PLL 100.

In the exemplary embodiment of the invention shown in FIG. 1, the modulation signal X is generated by an accumulator 110; in particular, the modulation signal X is generated by an overflow output OVF of the accumulator 110. The accumulator 110 is clocked by the signal Sb, and receives at a first input thereof a parameter K; an output ACC of the accumulator is routed back to a second input of the accumulator 110. In this way, at each cycle of the signal Sb the accumulator 110 adds the value K of the parameter K to the current accumulator value. The accumulator 110 includes a binary counter (not shown) capable of counting up to a value F. The value K of the parameter K is an adjustment value, consisting of an integer variable from 0 to the value F; the ratio K/F defines a fractional component of the selected channel. As a result of the described arrangement, the average fractional divide factor implemented by the divider 105 is equal to (N+K/F): on average, the frequency Fb of the signal Sb is thus equal to the frequency Fo divided by (N+K/F).

The signal Sb resulting from the frequency division is fed back to a Phase/Frequency Detector (PFD) 115.

The PFD 115 is capable of detecting a phase difference between the feedback signal Sb and the reference signal Sr either lower than +/−2π or higher than +/−2π (the latter phase difference being commonly interpreted as a frequency difference).

The PFD 115 has first and second output signals Up and Dw, which are used to control a charge pump 120. As depicted in FIG. 1, a typical charge pump 120 includes a high-side leg (referred to a power supply voltage VDD) and a low-side leg (referred to the ground GND). The high-side leg consists of a current generator 121$h$, generating a current I$h$, which is connected in series to a switch 122$h$; likewise, the low-side leg consists of a current generator 121$l$, generating a current Il, which is connected in series to a switch 122$l$. The switch 122$h$ and the switch 122$l$ are controlled by the signals Up and Dw, respectively. The high-side leg and the low-side leg of the charge pump 120 are connected to each other, and define an output terminal of the charge pump 120 that supplies a current Ip. Different embodiments for the charge pump are clearly possible.

The output ACC of the accumulator 110 is also fed to a phase-error-compensation circuit 125a. The phase-error-compensation circuit 125a, which will be described in detail in the following, substantially performs a digital-to-analog conversion of the (properly scaled) value in the accumulator 110, and generates a corresponding phase-error-compensation current Ic. The phase-error-compensation current Ic is used to condition the charge pump current Ip; for example, the current Ic is sunk from the output node of the charge pump 120.

A resulting control current Ipc, equal to the difference between the value of the charge pump current Ip and the value of the correction current Ic, is injected into a loop filter 135. The loop filter 135 removes the high frequency components from the control current Ipc; the control current Ipc is then integrated to obtain a corresponding control voltage Vc. The control voltage Vc drives a Voltage-Controlled Oscillator (VCO) 140, which generates the output signal So.

During the operation of the PLL 100, the VCO 140 starts oscillating at a free-run frequency, as a consequence of background noise in the circuit. The frequency divider 105 divides the frequency Fo of the output signal So by N or N+1, depending on the value X[n] of the modulation signal X. The divide factor oscillates about the nominal value N according to the fractional channel K/F; in a fractional cycle consisting of F reference cycles of the feedback signal Sb, the divide factor has an average value $N^*=N+K/F$ (the fractional frequency conversion factor).

In an unlock condition (such as at the power up or immediately after a channel switching), the frequency Fb of the feedback signal Sb is different from the frequency Fr of the reference signal Sr. Depending on whether the signal Sb leads or lags the reference signal Sr, the signal Up or Dw is asserted, the corresponding switch 122h or 122l is closed and the current generator 121h or 121d can thus inject/sink into/from the output terminal of the charge pump 120 the corresponding current Ih or Il. The charge pump current Ip consists of a series of pulses indicative of the phase difference between the signals Sb and Sr. Particularly, each pulse of the charge pump current Ip has a width proportional to the magnitude of the phase difference between the signals Sr and Sb; for example, the pulse is positive when the feedback signal Sb lags the reference signal Sr, and negative when the feedback signal Sb leads the reference signal Sr.

The corresponding control voltage Vc (disregarding the conditioning current Ic for the time being) updates the frequency Fo of the output signal So accordingly. Particularly, when the frequency Fb of the feedback signal Sb is lower than the reference frequency Fr, the control voltage Vc causes the VCO 140 to increase the output frequency Fo; conversely, when the frequency Fb of the feedback signal Sb is higher than the reference frequency Fr, the control voltage Vc instructs the VCO 140 to reduce the output frequency Fo.

The PLL 100 locks when the feedback signal Sb has, on average, the same frequency as the reference signal Sr. In this condition, the frequency Fo of the output signal So is thus, on average, equal to $Fr*N^*$. The PLL 100 is thus capable of generating an output signal So with a frequency Fo having a value that is a fractional multiple of the reference frequency Fr of the reference signal Sr, according to the fractional conversion factor $N^*=N+K/F$. Varying the value K, the output frequency Fo can be varied (this operation is also referred to as channel switching).

However, in the lock condition the feedback signal Sb and the reference signal Sr are not instantaneously at the same frequency. Particularly, whenever the divide factor of the frequency divider 105 is lower than the fractional conversion factor $N^*$, the frequency Fb of the feedback signal Sb is higher than the frequency Fr of the reference signal Sr; therefore, the phase difference between these two signals increases. Conversely, when the divide factor of the frequency divider 105 is higher than the fractional conversion factor $N^*$, the frequency Fb of the feedback signal Sb is lower than the frequency Fr of the reference signal Sr; therefore, the phase difference between these two signals decreases.

The pattern of variation of the phase error caused by the frequency divider 105 has a periodicity equal to the fractional cycle F. Spurious signals (shortly, spurs) are consequently generated at frequencies relatively close to the frequency Fo of the output signal So; therefore, these spurs cannot be filtered out by the loop filter, since this would require a too-narrow loop bandwidth (with an unacceptable increase in the settling time of the PLL 100).

An indication of the phase error value is given by the value contained in the accumulator 110. In fact, the accumulator 110 continuously adds the adjusting value K to itself; the accumulator has a capacity equal to F, and the overflow output OVF of the accumulator 110 provides the modulation value X[n]. Therefore, as long as the value contained in the accumulator is lower than the accumulator capacity, the frequency Fo of the output signal So is divided by N; when the accumulator overflows, the divide factor is incremented to N+1. Let it be assumed, by way of example only and for the sake of simplicity, that K=5 and that F=16 (a small value, corresponding to a relatively low number of selectable channels), meaning that the accumulator 110 comprises a four-bits counter. The content of the accumulator 110 over a fractional cycle is:

$$5,10,15,4(\uparrow),9,14,3(\uparrow),8,13,2(\uparrow),7,12,1\ (\uparrow),6,11,0(\uparrow)$$

where the symbol ($\uparrow$) is used to denote an accumulator overflow (indicated by the assertion to "1" of the overflow output OVF).

A total of five overflows occur in sixteen cycles of the signal Sb, so that the average divide factor implemented by the frequency divider 105 becomes the desired fractional conversion factor $N^*=N+5/16$.

After the first cycle, the phase error between the feedback signal Sb and the reference signal Sr is equal to $2\pi$ K/F radians, after the second reference cycle the phase error is equal to $2\pi*2K/F$ radians, and so on. When the accumulator 110 overflows, the frequency Fo of the output signal So is divided by N+1; in this way, the phase error is decreased by a full cycle of the feedback signal ($2\pi$). More generally, denoting with i the content of the accumulator 110, the phase error is always given by $2\pi*i/F$.

The known phase-error-compensation techniques are based on the previous consideration: the content of the accumulator 110 provides an indication of the phase error.

Thus, the content of the accumulator 110, properly scaled, can be converted by means of a Digital-to-Analog Converter (DAC) into a phase-error-compensation current Ic, that is sunk/injected from/into the output node of the charge pump 120 for compensating the phase error between the signals Sb and Sr.

In particular, at every reference cycle, the phase-error-compensation circuit 125a converts the accumulated phase error present in the accumulator 110 into a corresponding phase-error-compensation current Ic, which conditions the charge pump current Ip.

Figure 2:
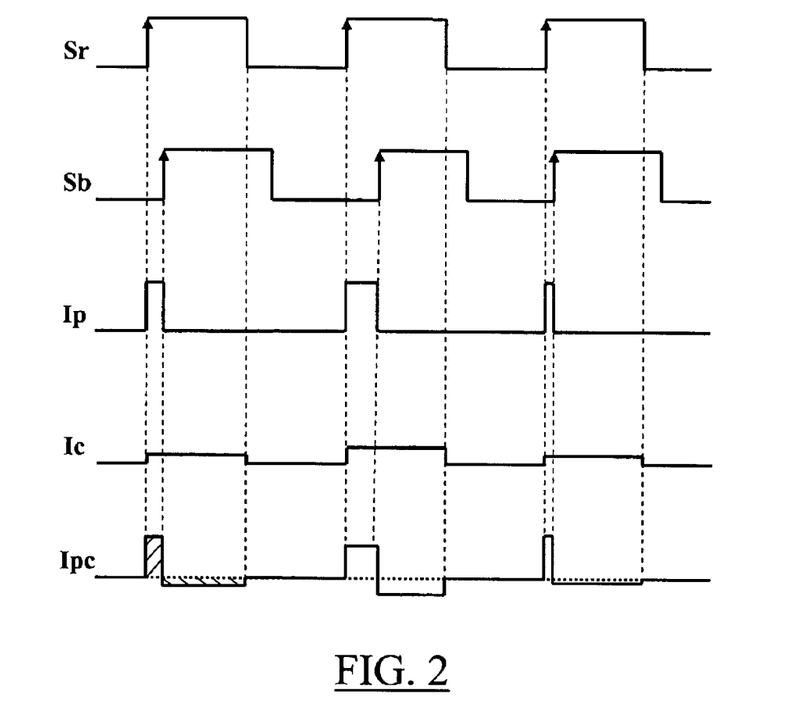
FIG. 2 is a simplified time diagram describing the operation of the phase-error-compensation circuit of FIG. 1 according to an embodiment of the invention.

Particularly, as shown in the simplified time diagram of FIG. 2, the phase error between the feedback signal Sb and the reference signal Sr in the locked condition results in a series of pulses of the charge pump current Ip; each pulse has a time duration (width) proportional to the magnitude of the phase error (with a constant amplitude). The conditioning current Ic consists of a series of pulses, which are for example generated in response to the rising edges of the reference signal Sr. Each pulse has a constant width defined by the circuit designer, usually correlated to the period of the reference signal Sr, the pulse amplitude corresponds instead to the accumulated phase error value present in the accumulator 110. In an ideal condition, the area of each pulse of the conditioning current Ic is the same as the area of the corresponding pulse of the charge-pump current Ip; as a consequence, the control current Ipc injected into the loop filter in every reference cycle is zero (i.e., the positive area is the same as the negative area).

As mentioned in the introductory part of the present description, according to the known phase-error-compensation techniques, a multi-bit DAC having a number of bits equal to the number of bits of the accumulator 110 is employed for converting the accumulator value.

However, the number of bits of the accumulator 110, i.e., the number of bits of the counter within the accumulator, determines the number of different selectable channels; the higher the number of selectable channels, the higher the number of bits of the accumulator 110. In practice, the number of selectable channels can be very high; for example, it may be necessary to have a number of selectable channels equal to $2^{16}$, so that an accumulator of sixteen bits is required. Multi-bit DACs with such a high number of bits, i.e., such a high resolution, are difficult to be implemented, and consume a lot of power.

It has been observed that one way to reduce the required DAC resolution consists in truncating the accumulator value, e.g., by dropping a given number of bits starting from the least significant bit. Referring again to the example of a sixteen-bits accumulator, the eight least-significant bits of the accumulator output ACC could be dropped, and the eight most-significant bits of the accumulator output ACC could be directly fed to an eight-bits DAC.

However, it has been observed that a truncation and quantization error is in this way introduced in the phase-error compensation current Ic, with the consequence of introducing spurious signals of non-negligible energy, at frequencies close to the output frequency Fo.

According to an embodiment of the present invention, a solution is provided that is adapted to keep the number of bits of the multi-bit DAC reasonably low, at the same time limiting the energy of the spurious signals.

In particular, the phase-error-compensation circuit 125a includes a rounding circuit 170a, that receives the accumulator output ACC of, e.g., sixteen bits, defining the phase error value, and outputs a digital code with a reduced number of bits, e.g., eight bits, defining a rounded phase error value.

For the purposes of an embodiment of the present invention, by rounding there is intended any possible rounding, performed according to any possible rounding rules, that allows obtaining, starting from a binary code defining a value with a higher level of resolution, a binary code with fewer bits, defining said value with a lower level of resolution.

In particular, in an embodiment of the present invention, the multi-bit output ACC of the accumulator 110 is divided into a first and a second groups of bits ACC1 and ACC2, respectively. Identified by m the number of bits in the accumulator output ACC (the maximum accumulator value F being thus equal to $2^m$), the first group of bits ACC1 includes the n least-significant bits of the accumulator output ACC, while the second group of bits ACC2 includes the p=(m−n) most-significant bits of the accumulator output ACC; for example, assuming that m=16, the first group of bits ACC1 may include nine bits (n=9), and the second group of bits ACC2 includes the remaining seven bits (m−n=16−9=7). The second group of bits ACC2 defines a truncated value obtained by truncation of the accumulator value ACC, i.e., by dropping from the sixteen-bits digital code ACC the nine bits in the first group of bits ACC1. The truncated value defined by the second group of bits ACC2 is then rounded up or off according to the value defined by the first group of bits ACC1. For example, as depicted in FIG. 1, the second group of bits ACC2, i.e., the truncated accumulator value, and a most-significant bit ACC1 [MSB] of the first group of bits ACC1 are fed to an adder 145; the remaining bits of the first group of bits ACC1 are dropped.

Figure 3:
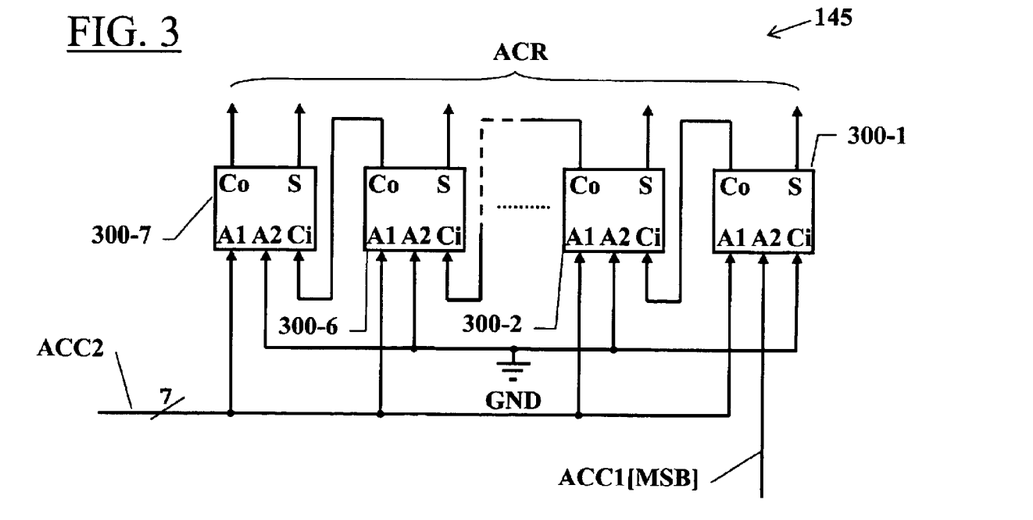
FIG. 3 schematically shows an adder incorporated in the phase-error-compensation circuit of the PLL of FIG. 1 according to an embodiment of the invention.

FIG. 3 is a block diagram of the adder 145, in an embodiment of the present invention. The adder 145 includes for example a number of full adders 300-1–300-7 equal to the number of bits (m−n) in the second group of bits ACC2, for example seven full adders. Each full adder 300-1–300-7 has a first addend input A1, a second addend input A2, a carry-in input Ci, a sum output S and a carry-out output Co. A first full adder 300-1 has the first and second addend inputs A1 and A2 respectively fed by a least-significant bit of the second group of bits ACC2 and the most-significant bit ACC1 [MSB] of the first group of bits ACC1; the carry-in input Ci of the first adder 300-1 is connected to ground. All the remaining adders 300-2–300-7 have the first addend input fed by a respective one of the remaining bits of the second group of bits, and the carry-in input Ci fed by the carry-out output C of the preceding adder; the second addend inputs A2 are instead connected to ground.

In the adder 145, the most-significant bit ACC1 [MSB] of the first group of bits ACC1 is added to the least-significant bit of the second group of bits ACC2; referring to the example considered above, the ninth bit of the first group of bits ACC1 is added to the first bit of the second group of bits. An output ACR of the adder 145 (including a number of bits equal to (m−n)+1, e.g., eight bits, for taking into account an adder carry, corresponding to the carry-out output Co of the last full adder 300-7) defines the rounded accumulator value, i.e., the rounded phase error value.

The following examples will clarify the rounding operation performed by the rounding circuit:

Example A

| | MSB ←------→ LSB | | | | | | | | | | | | | | | |
|---|---|---|---|---|---|---|---|---|---|---|---|---|---|---|---|---|
| ACC | 0 | 1 | 1 | 0 | 1 | 0 | 1 | 0 | 0 | 1 | 0 | 1 | 0 | 0 | 1 | 0 |
| ACC1 | | | | | | | | 0 | 0 | 1 | 0 | 1 | 0 | 0 | 1 | 0 |
| ACC2 | | | | | | | | | 0 | 1 | 1 | 0 | 1 | 0 | 1 | |
| ACR | | | | | | | | 0 | 0 | 1 | 1 | 0 | 1 | 0 | 1 | |

Example B

| | MSB ←------→ LSB | | | | | | | | | | | | | | | |
|---|---|---|---|---|---|---|---|---|---|---|---|---|---|---|---|---|
| ACC | 0 | 1 | 1 | 0 | 1 | 0 | 1 | 1 | 0 | 1 | 0 | 1 | 0 | 0 | 1 | 0 |
| ACC1 | | | | | | | | 1 | 0 | 1 | 0 | 1 | 0 | 0 | 1 | 0 |
| ACC2 | | | | | | | | | 0 | 1 | 1 | 0 | 1 | 0 | 1 | |
| ACR | | | | | | | | 0 | 0 | 1 | 1 | 0 | 1 | 1 | 0 | |

Example C

| | MSB ←------→ LSB | | | | | | | | | | | | | | | |
|---|---|---|---|---|---|---|---|---|---|---|---|---|---|---|---|---|
| ACC | 1 | 1 | 1 | 1 | 1 | 1 | 1 | 1 | 0 | 1 | 0 | 1 | 0 | 0 | 1 | 0 |
| ACC1 | | | | | | | | 1 | 0 | 1 | 0 | 1 | 0 | 0 | 1 | 0 |
| ACC2 | | | | | | | | | 1 | 1 | 1 | 1 | 1 | 1 | 1 | 1 |
| ACR | | | | | | | | 1 | 0 | 0 | 0 | 0 | 0 | 0 | 0 | 0 |

Alternatively, elementary adders without a carry-in input may be used, whereby the carry-out output of the previous adder is fed to one of the two addend inputs of the next adder.

The rounded accumulator value is fed to a scaler 150 and then to a multi-bit DAC 155 capable of converting a digital code of (m−n)+1 bits. The DAC 155 converts the rounded accumulator value ACR, i.e., the rounded phase error, into a phase-error-compensation current Ic, which is applied to the output node of the charge pump 120.

It has been found that rounding the phase-error value provided by the accumulator 110 allows reducing the resolution of the DAC used for generating the phase-error-compensation current; at the same time, the low-frequency spurs that are inevitably generated as a consequence of the rounding have an energy level lower (approximately a factor of two) than that of the low-frequency spurs that would be generated by a simple truncation process of the value provided by the accumulator.

Figure 4:
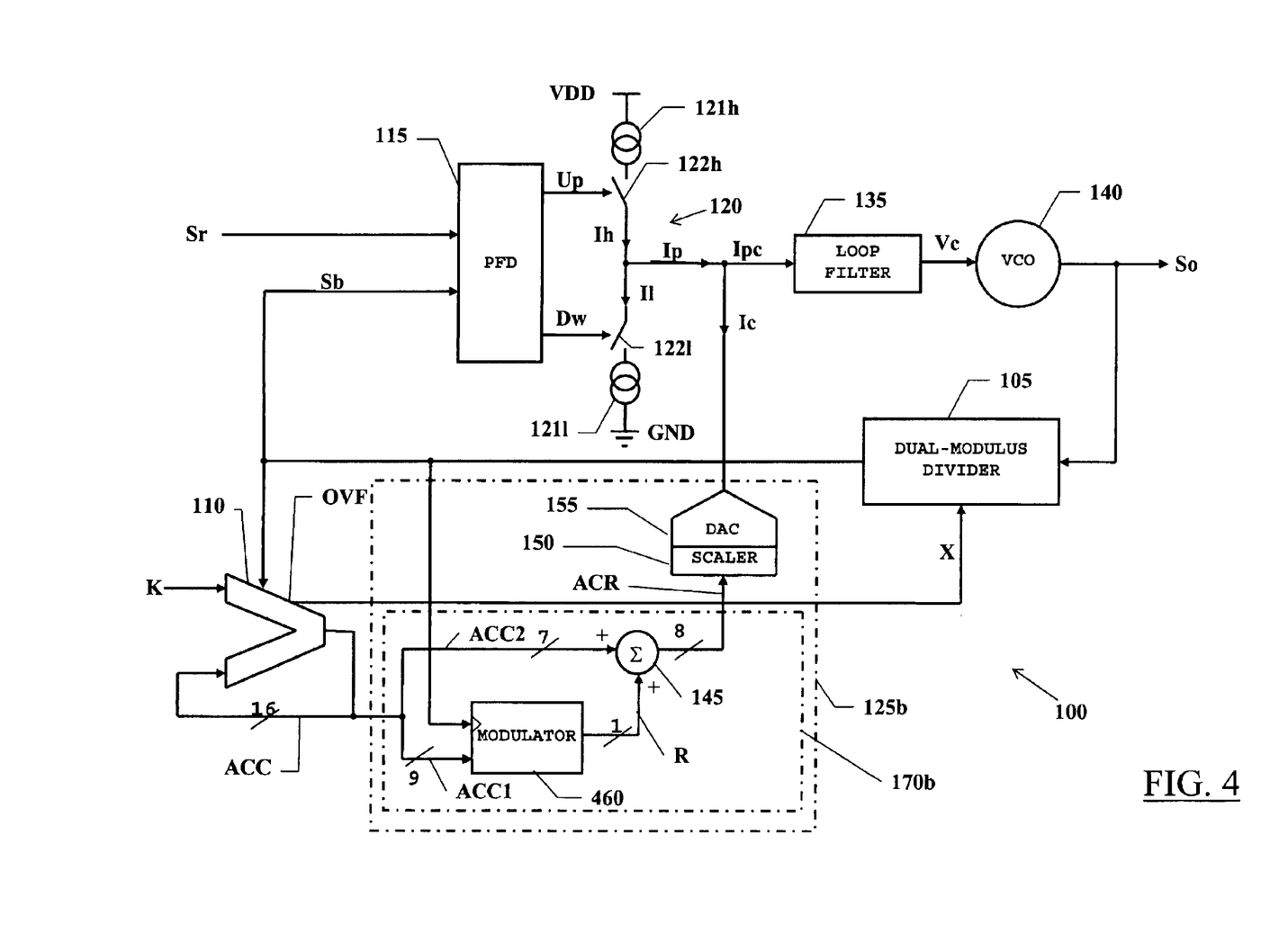
FIG. 4 schematically shows a fractional-N PLL frequency synthesizer including a phase-error-compensation circuit, according to a second embodiment of the present invention.

Referring now to FIG. 4, a phase-error-compensation circuit 125*b* according to a second embodiment of the present invention additionally includes, in a rounding circuit 170*b* corresponding to the rounding circuit 170*a*, a signal modulator 460, clocked, for example, by the feedback signal Sb; the signal modulator 460, for example, a single-bit second- or higher-order sigma-delta modulator, receives as an input value the value defined by the first group of bits ACC1, and generates, at a single-bit output R thereof, a stream of "1"s and "0"s. The output R of the signal modulator 460 is then fed, as in the previous embodiment, to the adder 145.

The principles of sigma-delta modulation are known, and will not be described in detail. The sigma-delta modulator 460 includes a truncator that performs a coarse quantization discarding the least-significant bits of its input value, defined by the first group of bits ACC1. One or more filters integrate an error resulting from the coarse quantization; which is then added to the input value through a feedback loop. The resulting value is then input to the truncator. The operations described above result, at the output R of the modulator, in a stream of "1"s and "0"s in the exemplary case of a single-bit output that, averaged, represents the value defined by the first group of bits ACC1. The sigma-delta modulator 460 spreads the quantization-error power over a relatively wide band, so that the energy density in the working band of the PLL 100 is reduced. Moreover, each filter in the sigma-delta modulator 460 shapes the quantization error so that its spectrum is not uniform, thereby pushing the quantization error power out of the band of interest; the degree of noise shaping is defined by the number of filters (referred to as the order of the sigma-delta modulator 110).

The use of the signal modulator 460 instead of the rounding technique of the accumulated phase error implemented by the rounding circuit 170*a* strongly reduces the energy of the spurious signals caused by the residual error determined by rounding process (in which the less significant bits of the binary code ACC are discarded), and shapes these signals out of the band of the loop filter; in this way, the spurious signals can be filtered out by the loop filter.

It is observed that, more generally, the signal modulator 460, e.g., the sigma-delta modulator, can be of the multi-bit type, having a multi-bit output R, that is added to the value defined by the second group of bits ACC2 to obtain the rounded value ACCR. Multi-bit input adders can, for example, be used.

Figure 5:
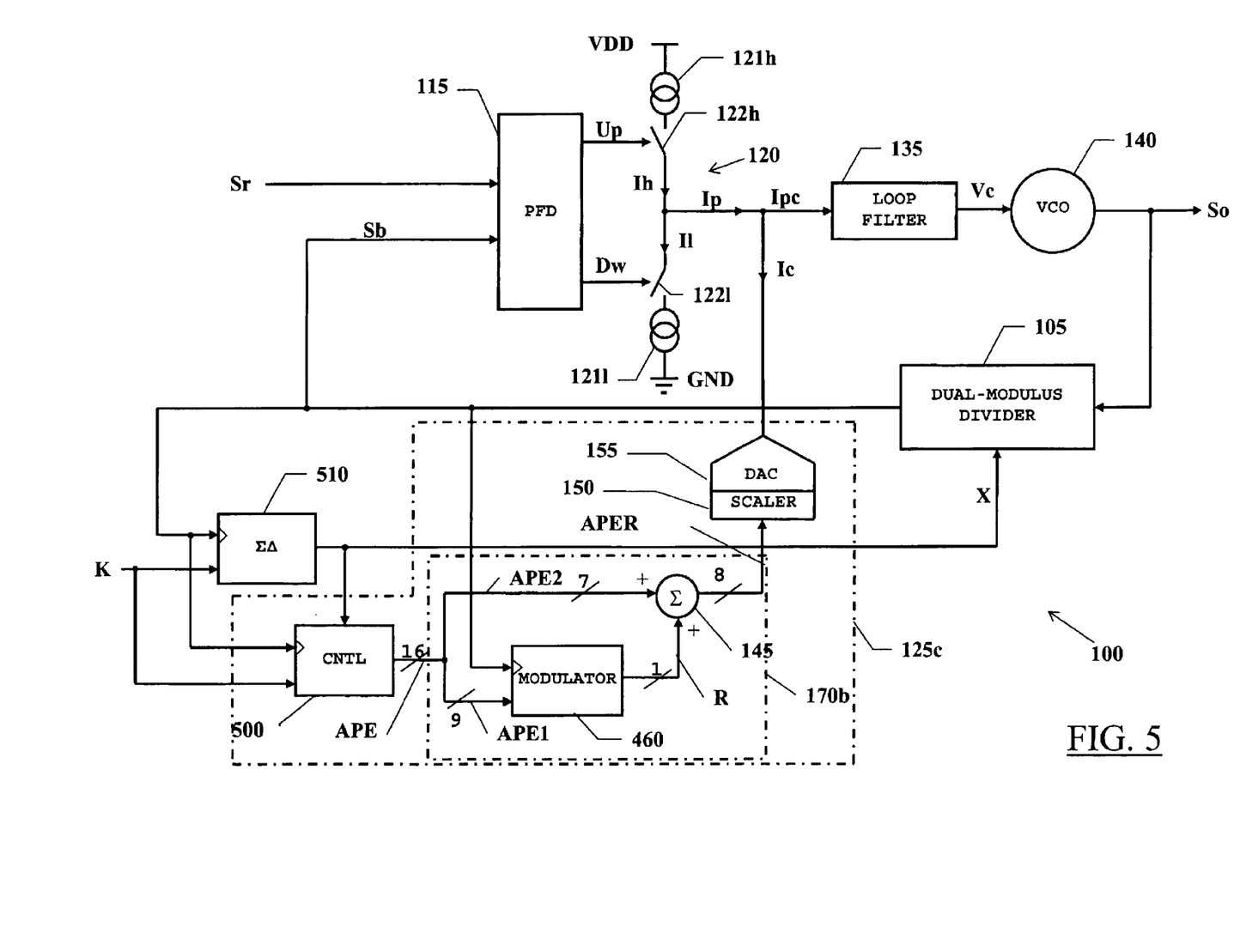
FIG. 5 schematically shows a fractional-N PLL frequency synthesizer according to a third embodiment of the present invention.

FIG. 5 is a schematic diagram of a fractional-N PLL according to a third embodiment of the present invention. In this embodiment, the accumulator 110 of the previous embodiments is replaced by a sigma-delta modulator 510, for example a single-bit sigma-delta modulator of the second order (although multi-bit and/or higher-order modulators can be exploited, and provide better performances). The possibility of using a sigma-delta modulator instead of the accumulator 110 is based on the consideration that the operation performed by the accumulator 110 can be interpreted as a (first-order) modulation of the adjusting value K: the accumulator converts the fractional component of the divide factor into a sequence of bits, which take the value "1" whenever the accumulator overflows.

Using a single-bit or a multi-bit, second-order or higher-order sigma-delta modulator instead of the accumulator allows to better shape the frequency division control pattern (pushing the power of the spurs to higher frequency, where the loop filter is more effective).

Similarly to the accumulator 110, the sigma-delta modulator 510 receives the adjusting value K, is clocked by the feedback signal Sb, and provides a modulation value X[n]. For example, in case the frequency divider 105 is a dual-modulus divider, the sigma-delta modulator 510 can have a single-bit output, providing a stream of "1"s and "0"s that, averaged, provides a value equal to the adjusting value K.

The use of the sigma-delta modulator 510 for generating the modulation value X[n] reduces the level of the in-band spurious signals introduced by the periodic variation of the frequency-divide factor. The sigma-delta modulator 510 spreads the quantization-error power over a large band, so that its density in the band of operation of the PLL 100 is reduced. Moreover, each filter of the modulator shapes the quantization error so that its spectrum is not uniform, thereby pushing the quantization-error power out of the band of interest. As a consequence, the out-of-band quantization error can be reduced by the loop filter 135. The shaping of the frequency-divide-factor pattern is further improved when the sigma-delta modulator 510 is of a multi-bit type, wherein the modulation value X[n] is represented by two or more bits; this type of modulator can be used in conjunction with a multi-modulus frequency divider.

Differently from the previous two embodiments, in this embodiment the value of the phase error between the feedback signal Sb and the reference signal Sr is not readily available in an accumulator.

Therefore, a different methodology is followed to compute the accumulated phase error. In particular, a phase-error-compensation circuit 125c according to a third embodiment of the present invention includes a control logic 500 for calculating a value APE, of a given number of bits, that corresponds to the accumulated phase error, as will be now explained.

The control logic 500, which is clocked by the feedback signal Sb, receives the adjusting value K and the output of the sigma-delta modulator 510 (i.e., the modulation signal X for the frequency divider 105).

The control logic 500 predicts an incremental value of the phase error (at any reference cycle) between the signals Sb and Sr, according to the parameters defining the selected frequency-conversion factor (i.e., the integer channel N, the adjusting value K and the modulus F) and to the current modulation value X[n].

It can in fact be demonstrated that when the modulation value X[n] is zero (and the frequency-divide factor is thus equal to N), the frequency divider 105 introduces an incremental phase error equal to $$2\pi \frac{K}{FN+K}$$

radians; the modulation of the frequency-divide factor by the sigma-delta modulator 510 (through the modulation value X[n]) subtracts $$2\pi \frac{Fx[n]}{FN+K}$$

radians from the incremental phase error. Therefore, a phase error Δϕ[n] at the n-th reference cycle can be calculated starting from the phase error Δϕ[n−1] at the preceding reference cycle according to the following formula:

$$\Delta\phi[n] = \Delta\phi[n-1] + 2\pi\left(\frac{K - Fx[n]}{FN+K}\right)$$

Considering that the adjusting value K is negligible with respect to the product FN, the formula may be approximated by:

$$\Delta\phi[n] = \Delta\phi[n-1] + 2\pi\left(\frac{K - Fx[n]}{FN}\right)$$

Thus, the values calculated, at a given reference cycle n, applying the above formula (either approximated or not) correspond to the accumulated phase error up to that reference cycle.

The calculated phase error APE generated by the control logic 500 is then processed in the same way as the content ACC of the accumulator 110 in the previous two embodiments. For example, referring to FIG. 5, a rounding circuit 170b similar to that described in connection with FIG. 4 can be used. The bits making up the calculated phase error APE are split into two groups of bits APE1 and APE2; the first group of bits APE1 is fed to the sigma-delta modulator 460; the output of the sigma-delta modulator 460 and the second group of bits APE2 are fed to the adder 145, and a rounded phase error APER is obtained, which is then converted into the compensation current Ic by the DAC 155.

Alternatively, the phase-error-compensation circuit 125c may include a rounding circuit similar to that shown in FIG. 1, without any signal modulator 460.

Figure 6:
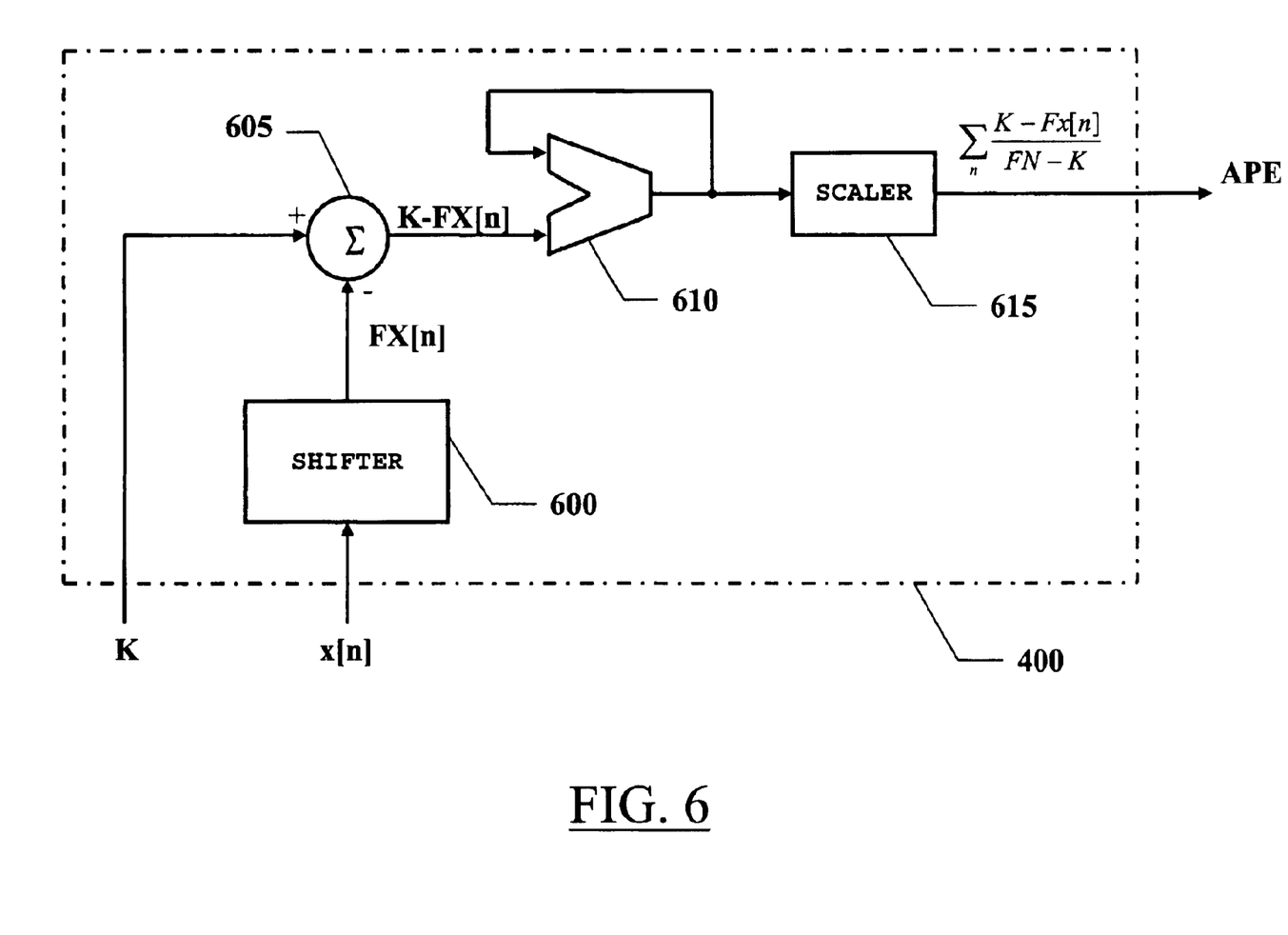
FIG. 6 is a schematic diagram of a control logic of a phase-error compensation circuit provided in the PLL of FIG. 5 according to an embodiment of the invention.

In FIG. 6 a schematic diagram of a possible embodiment of the control logic 500 is provided. The control logic 500 includes a multiplier 600 receiving the modulation value X[n]; depending on the characteristics of the PLL (for example, if the modulation value X[n] is expressed by a two-bits code, or where the modulus F is a power of two) the multiplier 600 can be implemented by means of a shifter. The shifter 600 multiplies the modulation value X[n] by the modulus F; for this purpose, the bits representing the modulation value X[n] are shifted leftwards a number of positions corresponding to the bits of the modulus F. For example, when the modulus F is $2^{16}$, the modulation value X[n] is shifted leftwards sixteen positions. An adder 605 subtracts the product FX[n] output by the shifter 600 from the adjusting value K. A resulting incremental value K−FX[n] is fed to a first input of an accumulator 610; the second input of the accumulator is directly connected to an output thereof. A scaler 615 scales the content of the accumulator 610 according to the value FN+K or, using the approximated formula, FN. The output of the scaler 615 forms the correction signal APE. This correction signal APE can be always positive, always negative or alternately positive and negative, depending on the implementation of the modulator. So the value defined by the signal APE can be expressed by a signed binary code with the appropriate number of bits (for example, consisting of sixteen bits).

It is observed that the control logic 500 may have a different architecture, and the correction signal APE may have different resolution. The scaler 615 could also be omitted: the function of the scaler 615 can be performed by the scaler 150.

In order to overcome problems of non-linearity of the DAC 155, due to the intrinsic mismatches among the different single-bit DAC elements (different currents associated to each bit of the rounded phase-compensation value ACR or APER), the DAC 155 may include a converter, receiving the phase-compensation value APER or ACR, that converts the (binary) representation of the correction value APER or ACR into a so-called thermometric code representation. The thermometric representation of the correction value is fed to a scrambler, that produces a randomly or pseudo-randomly scrambled version of the thermometric code. This randomly or pseudo-randomly scrambled version is then fed to the DAC.

It is pointed out that although in the present description reference has always been made to the use of a DAC for converting the rounded phase error value into a phase-compensation current, this is not to be intended as a limitation of the present invention. In general, the above-described embodiments of the invention allow reducing the required resolution of any circuit employed for generating a phase-error-compensation signal, starting from the accumulated phase error present in the accumulator or derived from the sigma-delta modulator driving the frequency divider; such a circuit may be a DAC, a Pulse-Width Modulator (PWM) or any other type of signal modulator. In the case of a PWM, for example, the compensation current Ic is sunk/injected with a constant amplitude, for a time duration that is controlled by the digital input of the PWM. So, it is possible to use a PWM with a reduced input bit resolution.

The circuit 100 may be part of an electronic system, such as, for example, a computer system or wireless communication device.

Although the present invention has been disclosed and described by way of some embodiments, it is apparent to those skilled in the art that several modifications to the described embodiments, as well as other embodiments of the present invention are possible without departing from the scope thereof.

What is claimed is:

1. A fractional-type phase-locked loop circuit, for synthesizing an output signal multiplying a frequency of a reference signal by a selected fractional conversion factor, the phase-locked loop circuit including:

a frequency divider for generating a feedback signal dividing the frequency of the output signal by a frequency division factor selectable among at least two different integer-value division factors;

frequency divider control means for causing the frequency division factor to vary between the at least two integer-value division factors in a pre-defined number of cycles, wherein an average frequency division factor over said pre-defined number of cycles has a fractional value;

means for compensating a phase error introduced by the frequency divider on the basis of a value indicative of the phase error obtained from said frequency divider control means, wherein said phase-error compensation means includes rounding means said rounding means receiving an input binary code with a first number of binary digits, indicative of the phase error value, and providing an output binary code with a second number of binary digits lower than the first number of digits, the output binary code defining a rounded phase error value.

2. The fractional-type phase-locked loop circuit of claim 1, in which said rounding means includes:

means for separating the input binary code into a first group of binary digits, containing the less significant binary digits of the input binary code, and a second group of binary digits, containing the most significant binary digits of the input binary code; and means for generating the output binary code by rounding a value defined by the second group of binary digits according to a rounding value defined by the first group of binary digits.

3. The fractional-type phase-locked loop circuit of claim 2, in which the rounding means include an adder for adding a value defined by at least one of the most significant digits of the first group of binary digits to a value defined by the second group of binary digits.

4. The fractional-type phase-locked loop circuit of claim 2, in which the rounding means further include a delta-sigma modulator receiving the first group of binary digits and generating the rounding value.

5. The fractional-type phase-locked loop circuit of claim 1, in which the phase-error-compensation means include means for generating a phase-error-compensation signal from said rounded phase error value, and for using the phase-error-compensation signal for conditioning a phase difference signal indicative of a phase difference between the feedback signal and the reference signal.

6. The fractional-type phase-locked loop circuit of claim 5, in which said means for generating a phase-error-compensation signal has a resolution corresponding to the number of digits of the output binary code.

7. The fractional-type phase-locked loop circuit of claim 6, in which said means for generating a phase-error-compensation signal include digital-to-analog conversion means for generating the phase-error-compensation signal by converting the rounded phase error value defined by the output binary code.

8. The fractional-type phase-locked loop circuit of claim 7, in which the digital-to-analog conversion means include a multibit digital-to analog converter.

9. The fractional-type phase-locked loop circuit of claim 1, in which said frequency divider control means include an accumulator having an accumulator overflow output controlling the frequency division factor of the frequency divider, and in which said input binary code carries a value contained in the accumulator.

10. The fractional-type phase-locked loop circuit of claim 1, in which said frequency divider control means include a sigma-delta modulator for generating a series of frequency divider control values determining a pattern of variation of the frequency division factor of the frequency divider, said series of values being generated starting from an adjustment value fed to the sigma-delta modulator, and in which the phase-error compensation means includes means for generating said input binary code by calculating an incremental value indicative of an incremental phase error according to the conversion factor and the series of frequency divider control values, and calculating the phase error value by accumulating the calculated incremental value.

11. A circuit for compensating for a phase error between first and second signals, comprising:

a truncator operable to receive a first data set having a first length, the first data set corresponding to the phase error, the truncator further operable to modify the first set to produce a second data set, the second set having a second length shorter than the first length; and a generator coupled to the truncator, the generator operable to generate an error-compensation signal corresponding to the second set.

12. The circuit of claim 11 wherein the truncator comprises a separator operable to separate the first set into first and second portions.

13. The circuit of claim 12 wherein:

the first portion has a third length; and the truncator further comprises a modifier operable to convert the first portion into a third data set having a fourth length shorter than the third length.

14. The circuit of claim 13 wherein the truncator further comprises a combiner operable to combine the second portion with the third set.

15. The circuit of claim 13 wherein the modifier comprises a delta-sigma modulator.

16. The circuit of claim 11 wherein the generator comprises a digital-to-analog converter.

17. A circuit for compensating for a phase error between first and second signals, comprising:

a separator operable to receive a first data set having a first length, the first data set corresponding to the phase error, the separator further operable to separate the first set into first and second portions, the first portion having a second length;

a modifier coupled to the separator, the modifier operable to convert the first portion into a second data set having a third length shorter than the second length; and a combiner coupled to the modifier, the combiner operable to combine the second portion with the second set to produce a third data set from which an error-compensation signal is produced, the third set having a fourth length shorter than the first length.

18. A method of compensating for a phase error between first and second signals, comprising:

receiving a first data set having a first length, the first data set corresponding to the phase error;

producing a second data set from the first set, the second set having a second length shorter than the first length; and producing an error-compensation signal from the second set.

19. The method of claim 18 wherein producing the second data set comprises separating the first set into first and second portions.

20. The method of claim 19 wherein:

the first portion has a third length; and producing the second data set further comprises converting the first portion into a third data set having a fourth length shorter than the third length.

21. The method of claim 20 wherein producing the second data set further comprises combining the second portion with the third set.

22. A phase-locked loop, comprising:

a circuit operable to introduce a phase error between first and second signals;

a truncator coupled to the circuit, the truncator operable to receive a first data set having a first length, the first data set corresponding to the phase error, the truncator further operable to modify the first set to produce a second data set, the second set having a second length shorter than the first length; and a generator coupled to the truncator, the generator operable to generate a compensation signal corresponding to the second set.

23. An electronic system, comprising:

a circuit for compensating for a phase error between first and second signals, comprising:

a truncator operable to receive a first data set having a first length, the first data set corresponding to the phase error, the truncator further operable to modify the first set to produce a second data set, the second set having a second length shorter than the first length; and a generator coupled to the truncator, the generator operable to generate a compensation signal corresponding to the second set.

* * * * *